US009360610B2

(12) United States Patent
Li et al.

(10) Patent No.: US 9,360,610 B2
(45) Date of Patent: Jun. 7, 2016

(54) BORATE BIREFRINGENT CRYSTAL APPLICABLE TO ULTRAVIOLET (UV) OR DEEP ULTRAVIOLET (DUV) RANGE, AND GROWTH METHOD AND USE THEREOF

(75) Inventors: Rukang Li, Beijing (CN); Yingying Ma, Beijing (CN)

(73) Assignee: Technical Institute of Physics and Chemistry, Chinese Academy of Sciences, Haidian District, Beijing (CN)

( * ) Notice: Subject to any disclaimer, the term of this patent is extended or adjusted under 35 U.S.C. 154(b) by 77 days.

(21) Appl. No.: 14/128,370

(22) PCT Filed: Feb. 17, 2012

(86) PCT No.: PCT/CN2012/000189
§ 371 (c)(1),
(2), (4) Date: Dec. 20, 2013

(87) PCT Pub. No.: WO2012/174846
PCT Pub. Date: Dec. 27, 2012

(65) Prior Publication Data
US 2014/0133014 A1    May 15, 2014

(30) Foreign Application Priority Data

Jun. 21, 2011  (CN) .......................... 2011 1 0167966

(51) Int. Cl.
| | |
|---|---|
| *C30B 9/12* | (2006.01) |
| *G02B 5/30* | (2006.01) |
| *C30B 29/22* | (2006.01) |
| *G02B 1/02* | (2006.01) |
| *C30B 11/06* | (2006.01) |
| *C30B 11/02* | (2006.01) |
| *C30B 15/20* | (2006.01) |
| *C30B 17/00* | (2006.01) |

(52) U.S. Cl.
CPC ............... *G02B 5/3091* (2013.01); *C30B 9/12* (2013.01); *C30B 11/02* (2013.01); *C30B 11/06* (2013.01); *C30B 15/20* (2013.01); *C30B 17/00* (2013.01); *C30B 29/22* (2013.01); *G02B 1/02* (2013.01); *G02B 5/3083* (2013.01)

(58) Field of Classification Search
CPC .............. G02B 1/02; G02B 1/08; G02B 5/30; G02B 5/3008; G02B 5/3083; G02B 5/32; G02B 5/3091; G02B 27/28; G02B 27/283; C30B 15/00–15/36; C30B 9/00; C30B 9/04–9/12; C30B 17/00; C01B 35/12; C01B 35/126; C01B 35/128
USPC .......... 359/350, 352, 489.01–489.13; 117/11, 117/13, 14, 16, 23, 28, 36, 73, 78, 81; 423/277
See application file for complete search history.

(56) References Cited

U.S. PATENT DOCUMENTS

| | | | | |
|---|---|---|---|---|
| 3,665,205 | A * | 5/1972 | Bridenbaugh et al. | 359/328 |
| 4,931,133 | A * | 6/1990 | Gualtieri et al. | 117/80 |
| 5,029,988 | A * | 7/1991 | Urino | G02B 5/1833 359/489.06 |
| 5,343,827 | A * | 9/1994 | Bordui et al. | 117/28 |
| 5,454,345 | A * | 10/1995 | Kouta et al. | 117/13 |
| 7,599,069 | B2 * | 10/2009 | Toussaint et al. | 356/491 |

FOREIGN PATENT DOCUMENTS

CN          101798707 A      8/2010

OTHER PUBLICATIONS

Feigelson et al., "Growth and Evaluation of Nonlinear Optical Crystals for Laser Applications: Lithium Borate, Barium Borate and Silver Gallium Selenide," Center for Materials Research, Stanford University, Dec. 8, 1994.*
International Search Report issued May 17, 2012 for Application No. PCT/CN2012/000189, with English Translation (6 pages).
Liebertz et al., "Struktur und Kristallchemie von $Ba_2M(B_3O_6)_2$ mit M=Ca, Cd, Mg, Co und Ni", Zeitschrist fur Kristallographie 1984, vol. 168, pp. 293-297.

* cited by examiner

Primary Examiner — Stephone B Allen
Assistant Examiner — Adam W Booher
(74) Attorney, Agent, or Firm — Lewis Roca Rothgerber Christie LLP

(57) ABSTRACT

The present invention relates to a borate birefringent crystal applicable to ultraviolet (UV) or deep ultraviolet (DUV) range, with chemical formula of $Ba_2Mg(B_3O_6)_2$. The borate birefringent crystal belongs to a trigonal system, with space group of R-3 wherein a=0.70528(3) nm, c=1.65520(9) nm and Z=12. The barium magnesium borate birefringent crystal is negative uniaxial ($n_e<n_o$) with a birefringence of 0.077-0.229 and a transmission range of 177-3000 nm. The crystal is easy to cut, grind, polish, and preserve, and is stable in air and is not easy to deliquesce. The barium magnesium borate birefringent crystal can be grown by the Czochralski method, flux method or the method of spontaneous crystallization from a melt, and has larger birefringence ($n_o-n_e$=0.077-0.229). The crystal has important applications in the fields of optics and communications, e.g. for fabricating the polarizing beam splitter prism.

7 Claims, 3 Drawing Sheets

○ Ba
◉ Mg
● O
○ B

BORATE BIREFRINGENT CRYSTAL APPLICABLE TO ULTRAVIOLET (UV) OR DEEP ULTRAVIOLET (DUV) RANGE, AND GROWTH METHOD AND USE THEREOF

CROSS-REFERENCE TO RELATED APPLICATION(S)

The present application is a National Phase Patent Application and claims priority to and benefit of International Application Number PCT/CN2012/000189, filed on Feb. 17, 2012, which claims priority to and benefit of Chinese Patent Application Number 201110167966.0, filed on Jun. 21, 2011, the entire disclosures of which are incorporated herein by reference.

TECHNICAL FIELD

The present invention relates to a borate birefringent crystal applicable to ultraviolet (UV) or deep ultraviolet (DUV) range, specifically, to a barium magnesium borate (BMBO for short) birefringent crystal applicable to ultraviolet (UV) or deep ultraviolet (DUV) range, with chemical formula of $Ba_2Mg(B_3O_6)_2$, and growth method and use thereof.

BACKGROUND

A light beam incident to an anisotropic medium changes into two light beams after being refracted, which is called birefringence. The two refracted beams are linearly polarized light with vibration directions orthogonal to each other, one beam follows the law of refraction, which is called ordinary light (o light); and the other beam does not follow the law of refraction, which is called extraordinary light (e light). Due to the anisotropy of the crystalline materials, the size of the angle between the two refracted beams is related to the direction of propagation of light and polarization state of light. The birefringent crystals can be divided into uniaxial and biaxial crystals, wherein uniaxial crystal materials belong to a trigonal, tetragonal or hexagonal system, while biaxial crystal materials belong to a triclinic, monoclinic or orthorhombic system, and the birefringent materials convenient in use are uniaxial crystals. Birefringence of the crystal is an important optical parameter of optic-electric functional materials. Birefringent crystal materials have important applications in the fields of optics and communications, and widely used to fabricate polarizer prisms and polarizing beam splitter prisms and so on. In the following descriptions, "a" and "c" stand for unit cell parameters of a trigonal system; Z stands for the number of molecules in the unit cell; "$n_o$" and "$n_e$" stand for refractive indices for the ordinary wave and extraordinary wave respectively.

The commonly used birefringent crystal materials are mainly $MgF_2$ crystal, quartz crystal, $YVO_4$ crystal, calcite ($CaCO_3$) crystal, and crystals such as α-BBO crystal, $Ca_3(BO_3)_2$ crystal and $ReBa_3B_9O_{18}$ (Re=Y, Pr, Nd, Sm, Eu, Gd, Tb, Er, Dy, Ho, Tm, Yb, Lu) crystal which have been reported in recent years. The $MgF_2$ crystal has a transmission range of 110-8500 nm, which is an excellent material applied in DUV range; however, due to its low birefringence, the $MgF_2$ crystal is not suitable to fabricate Glan polarizers, but only suitable for Rochon polarizers; moreover, the light separation angle of the $MgF_2$ crystal is small and the size of the fabricated device is usually large, which limits its application. The quartz crystal is also disadvantaged in small birefringence, causing the same problem as $MgF_2$ crystal. The $YVO_4$ crystal is an excellent artificial birefringent crystal, however, its transmission range is 400-5000 nm, preventing it from being applied in the UV range. The calcite crystal with large birefringence is the most commonly used birefringent crystal, however, as it mainly exists in the form of natural minerals which usually contain high level of impurities, it is difficult to obtain the calcite crystal in ultraviolet optical level; devices based on the calcite crystal can normally be used for the wavelength above 350 nm, and applications in DUV (below 250 nm) cannot be achieved. In recent years, several borate birefringent crystals have been reported. The high temperature phase $BaB_2O_4$ (α-BBO) crystal has a transmission range of 189-3500 nm and a large birefringence, however, α-BBO crystal is easy to deliquesce and there exists solid-state phase transition in the crystal, making it easy to crack during crystal growth and thereby affecting the yield and availability of the crystal; besides, UV transmittance cut-off wavelength of the α-BBO crystal is only 189 nm, which limits its application in wavelength range below 200 nm. The $Ca_3(BO_3)_2$ crystal has a transmission range of 180-3800 nm, however, it is disadvantaged in small birefringence in the visible region and low transmittance in the deep UV region, which also limits its use. Due to containing rare earth elements, the $YBa_3B_9O_{18}$ crystal has absorption in the ultraviolet region, with transmittance being 50% at 300 nm and decreasing to 10% at 220 nm, and therefore is not suitable for use in the DUV range. The $Ba_2Mg(B_3O_6)_2$ birefringent crystal of the prevent invention has a wide transmittance range (177-3000 nm) and large birefringence ($n_o-n_e$=0.077-0.229), and can be applied in ultraviolet (UV) or deep ultraviolet (DUV) range (180-350 nm).

SUMMARY

One purpose of the present invention is to provide a barium magnesium borate birefringent crystal applicable to ultraviolet (UV) or deep ultraviolet (DUV) range, with chemical formula of $Ba_2Mg(B_3O_6)_2$ (BMBO for short), which has a wide transmittance range (177-3000 nm) and large birefringence ($n_o-n_e$=0.077-0.229), and can be applied in ultraviolet (UV) or deep ultraviolet (DUV) range (180-350 nm).

Another purpose of the present invention is to provide a method for growing the borate birefringent crystal of $Ba_2Mg(B_3O_6)_2$ (BMBO for short) applicable to ultraviolet (UV) or deep ultraviolet (DUV) range.

Yet another purpose of the present invention is to provide use of the borate birefringent crystal of $Ba_2Mg(B_3O_6)_2$ (BMBO for short) applicable to ultraviolet (UV) or deep ultraviolet (DUV) range.

In order to achieve the above purposes, the technical solutions of the present invention are described as follows.

The present invention provides a borate birefringent crystal applicable to ultraviolet (UV) or deep ultraviolet (DUV) range, with chemical formula of $Ba_2Mg(B_3O_6)_2$.

The borate birefringent crystal applicable to ultraviolet (UV) or deep ultraviolet (DUV) range belongs to a trigonal system, with space group of R-3 wherein a=0.70528(3) nm, c=1.65520(9) nm and Z=12; the barium magnesium borate birefringent crystal is negative uniaxial ($n_e<n_o$) with a transmission range of 177-3000 nm and a birefringence of 0.077-0.229; and the borate birefringent crystal is easy to cut, grind, polish and preserve, and is stable in air and is not easy to deliquesce.

The present invention provides a method for growing the borate birefringent crystal applicable to ultraviolet (UV) or deep ultraviolet (DUV) range, comprising: growing crystal by a method of spontaneous crystallization from a melt, Czochralski method or flux method.

The steps of growing crystal by the method of spontaneous crystallization from a melt are as follows:

mixing and grinding a compound containing barium, compound containing magnesium and compound containing boron in which the molar ratio of barium, magnesium and boron is 2:1:6, then putting the mixture into a platinum crucible, heating the mixture to a molten state to obtain a mixed melt, and stirring the mixed melt for 24-48 hours; determining saturation temperature of the mixed melt by experimenting with seed crystal, and when heating the mixed melt to 2-20° C. above the saturation temperature, putting a seed rod without seed crystal into the melt; then cooling the melt at a rate of 0.05-5° C./h for spontaneously crystallizing, then letting the crystal grow at a cooling rate of 0.05-5° C./d; and pulling the crystal out of the melt surface when the crystal grows to a size of centimeter level, and cooling the melt to room temperature at a rate of 2-100° C./h to obtain the barium magnesium borate birefringent crystal.

The steps of growing crystal by the Czochralski method are as follows:

mixing and grinding a compound containing barium, compound containing magnesium and compound containing boron in which the molar ratio of barium, magnesium and boron is 2:1:6, then putting the mixture into a platinum crucible, heating the mixture to a molten state to obtain a mixed melt, and stirring the mixed melt for 24-48 hours; determining saturation temperature of the mixed melt by experimenting with seed crystal, and when heating the mixed melt to 2-20° C. above the saturation temperature, putting a seed rod with the seed crystal fixed at its end into the mixed melt such that the seed rod is contacted with the surface of the mixed melt or dipped into the mixed melt; lowering the temperature of the mixed melt to the saturation temperature 0-60 minutes after the seed crystal is immerged, meanwhile rotating the seed rod at a rate of 0-100 rpm/min, then growing crystal at a pulling rate of 0.01-10 mm/h and a cooling rate of 0.05-5° C./d; and pulling the crystal out of the melt surface when the crystal grows to a size of centimeter level, and then cooling the melt to room temperature at a rate of 2-100° C./h to obtain the barium magnesium borate birefringent crystal.

The steps of growing crystal by the flux method are as follows:

mixing and grinding a compound containing barium, compound containing magnesium, compound containing boron and a flux, then putting the mixture into a platinum crucible, heating the mixture to a molten state to obtain a mixed melt, and stirring the mixed melt for 24-48 hours; determining saturation temperature of the mixed melt by experimenting with seed crystal, and when heating the mixed melt to 2-20° C. above the saturation temperature, fixing the seed crystal at an end of a seed rod, and putting the seed rod into the mixed melt in a growth furnace such that the seed rod is contacted with the surface of the mixed melt or dipped into the melt; lowering the temperature of the mixed melt to the saturation temperature 0-60 minutes after the seed crystal is immerged, meanwhile rotating the seed rod at a rate of 0-100 rpm/min; then growing crystal at a cooling rate of 0.05-5° C./d; and pulling the crystal out of the melt surface when the crystal grows to a size of centimeter level, and then cooling the melt to room temperature at a rate of 2-100° C./h to obtain the barium magnesium borate birefringent crystal;

wherein the compound containing barium, compound containing magnesium and compound containing boron in which the molar ratio of barium, magnesium and boron is 2:1:6 are mixed to form raw materials; and the molar ratio of the raw materials and the flux is 1: (0.2~4);

the flux is sodium fluoride, sodium oxide, barium fluoride, barium chloride, sodium chloride, lithium oxide, boron oxide or mixtures thereof.

The compound containing barium may be barium oxide, barium hydroxide, barium halide, barium carbonate, barium nitrate, barium sulfate, barium acetate or barium oxalate with purity not less than 99.9%; the compound containing magnesium may be magnesium oxide, magnesium hydroxide, magnesium halide, magnesium carbonate, magnesium nitrate, magnesium sulfate, magnesium acetate or magnesium oxalate with purity not less than 99.9%; and the compound containing boron may be boric acid or boron oxide with purity not less than 99.9%.

The purity of the flux is not less than 99.9%.

The present invention provides use of the borate birefringent crystal applicable to ultraviolet (UV) or deep ultraviolet (DUV) range for fabricating a polarizing beam splitter prism. The polarizing beam splitter prism may be a Glan polarizer, Wollaston polarizer, Rochon polarizer or beam displacing polarizer.

The advantages of the present invention are as follows: the $Ba_2Mg(B_3O_6)_2$ birefringent crystal of the present invention has a wide transmittance range (177-3000 nm) and large birefringence ($n_o-n_e=0.077-0.229$), and can be applied in ultraviolet (UV) or deep ultraviolet (DUV) range (180-350 nm). Moreover, the $Ba_2Mg(B_3O_6)_2$ birefringent crystal of the present invention is easy to cut, grind, polish and preserve, and stable in air and is not easy to deliquesce. Besides, it can be widely used for fabricating polarizing beam splitter prisms.

DETAILED DESCRIPTION OF PREFERRED EMBODIMENTS

Figure 1:
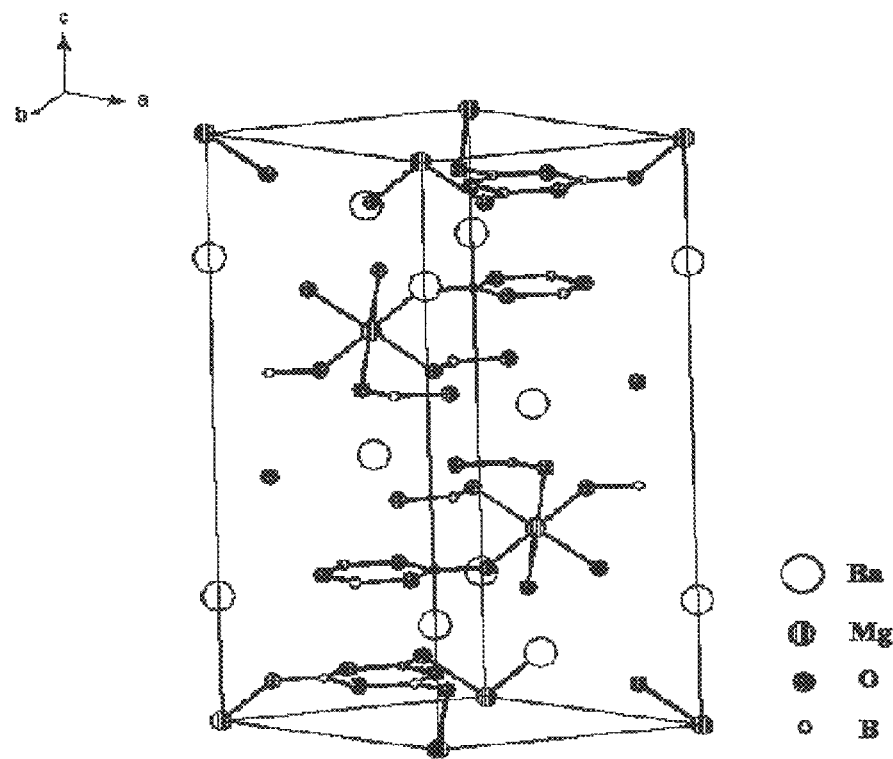
FIG. 1 is a diagram illustrating the structure of the barium magnesium borate birefringent crystal applied in ultraviolet (UV) or deep ultraviolet (DUV) range.

Embodiment 1, Growing $Ba_2Mg(B_3O_6)_2$ by the Czochralski method

| The raw materials used (analytical pure): | $BaCO_3$ | 986.7 g |
|---|---|---|
| | MgO | 100.75 g |
| | $H_3BO_3$ | 927.45 g |

(wherein the molar ratio of barium, magnesium and boron is 2:1:6)

The specific steps of the method are described as follows: the above raw materials were weighed, mixed and ground in a mortar, then put into a 85 mm×85 mm platinum crucible and heated to reach the molten state to obtain a mixed melt, and then the mixed melt was stirred for 48 hours; the saturation temperature of the above mixed melt was determined by experimenting with seed crystal; the seed crystal was immerged when the mixed melt was heated to 1° C. higher than the saturation temperature, then the seed crystal was fixed at the end of the seed rod, and the seed rod was put into the mixed melt in a self-made growth furnace, such that the seed rod was contacted with the surface of the mixed melt or dipped into the melt; the temperature was then lowered to the saturation temperature 30 minutes after the seed crystal was immerged, meanwhile the seed rod was rotated at a rate of 25rpm/min, then the crystal grew at a pulling rate of 0.05 mm/h and cooling rate of 0.1° C./d; the crystal grew gradually and was pulled out of the melt surface when it grew to a certain size, and then the melt was cooled to the room temperature at a rate of 7° C./h, finally a 41 mm×27 mm×9 mm crystal with large transparent region was obtained. Transmittance test was conducted on the obtained crystal, with the result showing the transmission range of 177-3000 nm.

Embodiment 2, Growing $Ba_2Mg(B_3O_6)_2$ by the method of spontaneous crystallization from a melt

| The raw materials used (analytical pure): | $BaCO_3$ | 197.36 g |
|---|---|---|
| | MgO | 20.17 g |
| | $H_3BO_3$ | 185.49 g |

(wherein the molar ratio of barium magnesium and boron is 2:1:6)

The specific steps of the method are described as follows: the above raw materials were weighed, mixed and ground in a mortar, then put into a 54 mm×48 mm platinum crucible and heated to reach the molten state to obtain a mixed melt, and then the mixed melt was stirred for 48 hours; the saturation temperature of the above mixed melt was determined by experimenting with seed crystal; the mixed melt was heated to 1° C. above the saturation temperature, and the seed rod without seed crystal was put into the melt, then the melt was cooled at a rate of 0.5° C./h for spontaneously crystallizing; after crystallizing, the cooling rate was set to be 0.5° C./d; the crystal grew gradually and was pulled out of the melt surface when it grew to a certain size, and then the melt was cooled to the room temperature at a rate of 15° C./h, finally a 40 mm×38 mm×2 mm crystal was obtained.

Embodiment 3, growing $Ba_2Mg(B_3O_6)_2$ by the flux method

| The raw materials used (analytical pure): | $BaCO_3$ | 78.95 g |
|---|---|---|
| | MgO | 8.06 g |
| | $H_3BO_3$ | 74.3 g |
| | NaF | 1.68 g |

(wherein the molar ratio of barium, magnesium, boron and sodium fluoride is 2:1:6:0.2, that is, the molar ratio of BMBO to NaF is 1:0.2)

The specific steps of the method are described as follows: the above raw materials were weighed, mixed and ground in a mortar, then put into a platinum crucible and heated to reach the molten state to obtain a mixed melt, and then the mixed melt was stirred for 48 hours; the saturation temperature of the above mixed melt was determined by experimenting with seed crystal; the seed crystal was immerged when the mixed melt was heated to 3° C. higher than the saturation temperature, then the seed crystal was fixed at the end of the seed rod and the seed rod was put into the mixed melt in a self-made growth furnace, such that the seed rod was contacted with the surface of the mixed melt or dipped into the melt; the temperature was then lowered to the saturation temperature 30 minutes after the seed crystal was immerged, meanwhile the seed rod was rotated at a rate of 15 rpm/min, then the melt was cooled at a rate of 0.1° C./d; the crystal grew gradually and was pulled out of the melt surface when it grew to a certain size, and then the melt was cooled to the room temperature at a rate of 15° C./h, finally a 10 mm×10 mm×5 mm crystal was obtained.

Embodiment 4, growing $Ba_2Mg(B_3O_6)_2$ by the flux method

| The raw materials used (analytical pure): | $BaCO_3$ | 78.95 g |
|---|---|---|
| | MgO | 8.06 g |
| | $H_3BO_3$ | 74.3 g |
| | NaF | 8.4 g |

(wherein the molar ratio of barium, magnesium, boron and sodium fluoride is 2:1:6:1, that is, the molar ratio of BMBO to NaF is 1:1)

The specific steps of the method are described as follows: the above raw materials were weighed, mixed and ground in a mortar, then put into a platinum crucible, and heated to reach the molten state to obtain a mixed melt, and then the mixed melt was stirred for 48 hours; the saturation temperature of the above mixed melt was determined by experimenting with seed crystal; the seed crystal was immerged when the mixed melt was heated to 3° C. higher than the saturation temperature, then the seed crystal was fixed at the end of the seed rod, and the seed rod was put into the mixed melt in a self-made growth furnace, such that the seed rod was contacted with the surface of the mixed melt or dipped into the melt; the temperature was then lowered to the saturation temperature 30 minutes after the seed crystal was immerged, meanwhile the seed rod was rotated at a rate of 15 rpm/min, then the melt was cooled at a rate of 0.1° C./d; the crystal grew gradually and was pulled out of the melt surface when it grew to a certain size, and then the melt was cooled to the room temperature at a rate of 15° C./h, finally a 14 mm×10 mm×6 mm crystal was obtained.

Embodiment 5, growing $Ba_2Mg(B_3O_6)_2$ by the flux method

| The raw materials used (analytical pure): | $BaCO_3$ | 78.95 g |
|---|---|---|
| | MgO | 8.06 g |
| | $H_3BO_3$ | 74.3 g |
| | NaF | 33.6 g |

(wherein the molar ratio of barium, magnesium, boron and sodium fluoride is 2:1:6:4, that is, the molar ratio of BMBO to NaF is 1:4)

The specific steps of the method are described as follows: the above raw materials were weighed, mixed and ground in a mortar, then put into a platinum crucible, and heated to reach the molten state to obtain a mixed melt, and then the mixed melt was stirred for 48 hours; the saturation temperature of the above mixed melt was determined by experimenting with seed crystal; the seed crystal was immerged when the mixed melt was heated to 3° C. higher than the saturation temperature, then the seed crystal was fixed at the end of seed rod, and the seed rod was put into the mixed melt in a self-made growth furnace, such that the seed rod was contacted with the surface of the mixed melt or dipped into the melt; the temperature was then lowered to the saturation temperature 30 minutes after the seed crystal was immerged, meanwhile the seed rod was rotated at a rate of 15 rpm/min, then the melt was cooled at a rate of 0.1° C./d; the crystal grew gradually and was pulled out of the melt surface when it grew to a certain size, and then the melt was cooled to the room temperature at a rate of 15° C./h, finally a 12 mm×9 mm×6 mm crystal was obtained.

Figure 2:
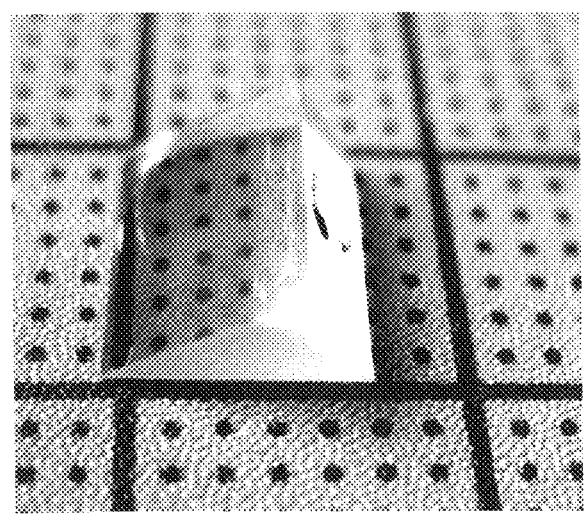
FIG. 2 shows a prism cut from the grown barium magnesium borate birefringent crystal applied in ultraviolet (UV) or deep ultraviolet (DUV) range according to the present invention.
Figure 3:
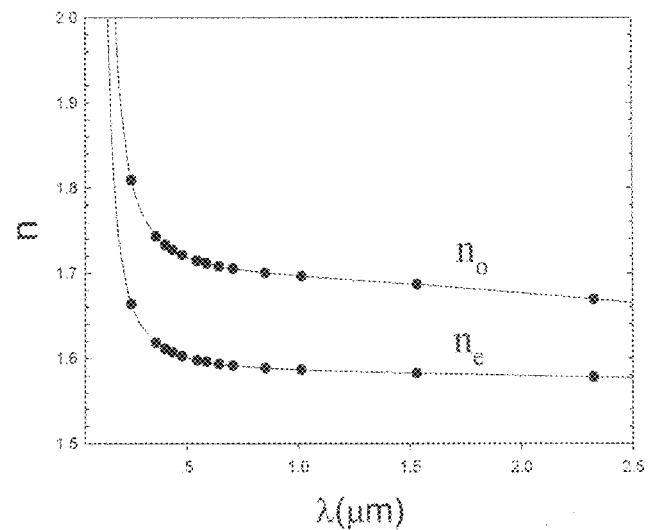
FIG. 3 is a diagram illustrating the relationship between the refractive index n and the wavelength λ of the barium magnesium borate birefringent crystal applied in ultraviolet (UV) or deep ultraviolet (DUV) range according to the present invention.

Embodiment 6, measurement on the refractive indexes of $Ba_2Mg(B_3O_6)_2$ crystals prepared in the above embodiments A prism (FIG. 2) was cut from the crystal obtained in Embodiment 1 for the refractive index measurement. Table 1 shows the measurement results of the refractive indexes of several wavelengths at 295K. Dispersion equations of the $Ba_2Mg(B_3O_6)_2$ crystal can be obtained by fitting with the Sellmeier equation:

$$n_e^2 = 2.507979 + \frac{0.013277}{\lambda^2 - 0.013615} - 0.003774\lambda^2$$

$$n_o^2 = 2.87791 + \frac{0.018944}{\lambda^2 - 0.01677} - 0.017475\lambda^2$$

the refractive indexes of the crystal prepared in Embodiment 1 can be calculated within certain wavelength range (180-3000 nm) by the above equations. FIG. 3 shows the relationship between the refractive index n and the wavelength $\lambda$.

Table 1 is as follows:

| Wavelength $\lambda$ (μm) | $n_e$ | $n_o$ | Birefringence $\Delta n$ |
|---|---|---|---|
| 0.2537 | 1.6642 | 1.8097 | 0.1455 |
| 0.3630 | 1.6183 | 1.7433 | 0.1250 |
| 0.4047 | 1.6113 | 1.7334 | 0.1221 |
| 0.5875 | 1.5958 | 1.7116 | 0.1158 |
| 1.0140 | 1.5866 | 1.6967 | 0.1081 |
| 2.3250 | 1.5780 | 1.6694 | 0.0914 |

Figure 4:
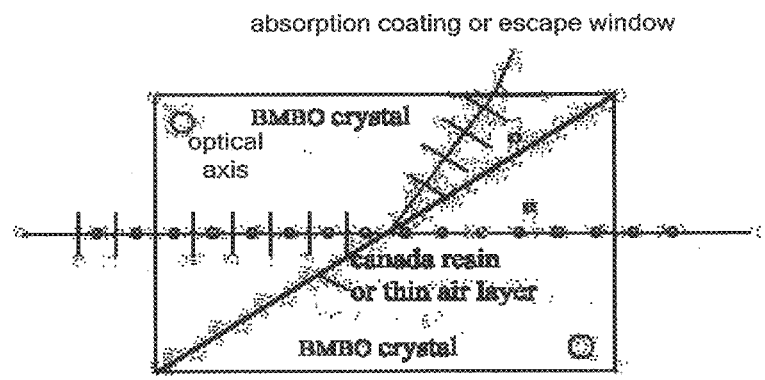
FIG. 4 is a schematic diagram illustrating a Glan polarizer fabricated by the barium magnesium borate birefringent crystal applied in ultraviolet (UV) or deep ultraviolet (DUV) range according to the present invention.

Embodiment 7, fabrication of the Glan polarizer by using the barium magnesium borate (BMBO) birefringent crystal applied in ultraviolet (UV) or deep ultraviolet (DUV) range provided in the present invention The Glan polarizer (FIG. 4) is formed by the birefringent crystal BMBO-Canada resin (or thin air layer)—birefringent crystal BMBO, wherein for the crystal, there is $n_e < n_o$. When the incident light is perpendicularly incident on the end face of the prism, no deflection occurs to the o light and the e light, the incident angle on the inclined plane is equal to the angle between the inclined and rectangular planes of the prism. In the fabrication of the prism, the angle between the inclined and rectangular planes of the prism is set to be larger than the critical angle of the o light on the cementing surface, so that the o light will be totally reflected on the cementing surface, and is absorbed by the coating on rectangular plane of the prism or leaks through the o light escape window; while the e light exits the prism without deflection due to the almost unchanged refractive index.

Figure 5:
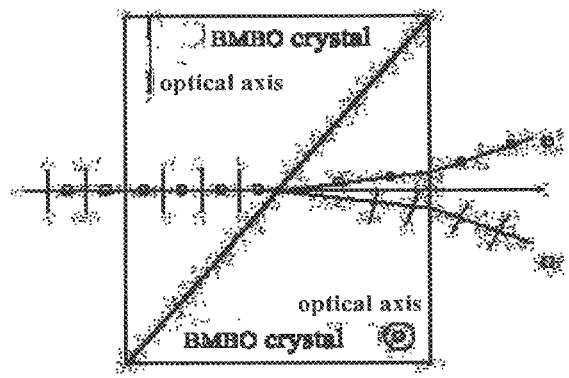
FIG. 5 is a schematic diagram illustrating a Wollaston polarizer fabricated by the barium magnesium borate birefringent crystal applied in ultraviolet (UV) or deep ultraviolet (DUV) range according to the present invention.

Embodiment 8, fabrication of the Wollaston polarizer by using the barium magnesium borate birefringent crystal of the present invention Two birefringent crystal BMBO prisms are combined to form a Wollaston polarizer (FIG. 5), in which the optical axes of the two birefringent crystal prisms are perpendicular to each other. When the incident light is perpendicularly incident on the end face of the prism, the o light and e light move at different speeds along the same direction in the prism 1. When the light enters into the prism 2 from the prism 1, the optical axis is rotated 90 degrees, which makes the o light change to the e light and the e light change to the o light. When entering into the air, the o light and e light both enter into the optically thinner medium from the optically denser medium, resulting in further separation of the two beams, then two linearly polarized beams are obtained. Larger birefringence is more beneficial for the separation of the beams.

Figure 6:
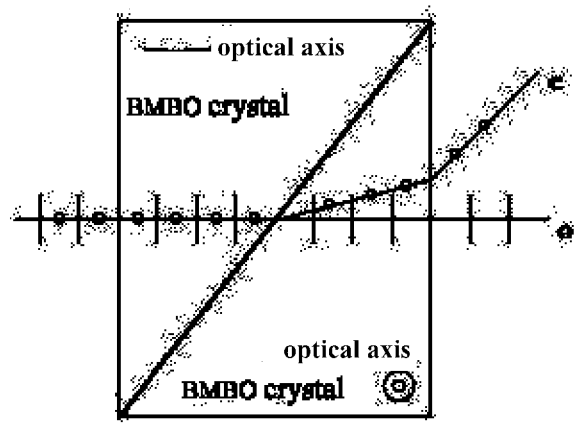
FIG. 6 is a schematic diagram illustrating a Rochon polarizer fabricated by the barium magnesium borate birefringent crystal applied in ultraviolet (UV) or deep ultraviolet (DUV) range according to the present invention.

Embodiment 9, fabrication of the Rochon polarizer by using the barium magnesium borate birefringent crystal of the present invention:

Two birefringent crystal BMBO prisms are combined to form a Rochon polarizer (FIG. 6), in which the optical axes of the two birefringent crystal prisms are perpendicular to each other. When the incident light is perpendicularly incident on the prism, the light propagates along the optical axis without birefringence in the first prism, the o light and e light move at the speed of the o light along the same direction. When the light enters into the second prism, the optical axis is rotated 90 degrees, resulting in that the e light vibrating parallel to the surface changes to the o light in the second prism, which remains the constant speed in the two prisms and exits the prism without deflection. The o light vibrating perpendicularly to the surface changes to the e light in the second prism, then two separated linearly polarized beams with vibration directions perpendicular to each other are obtained.

Figure 7:
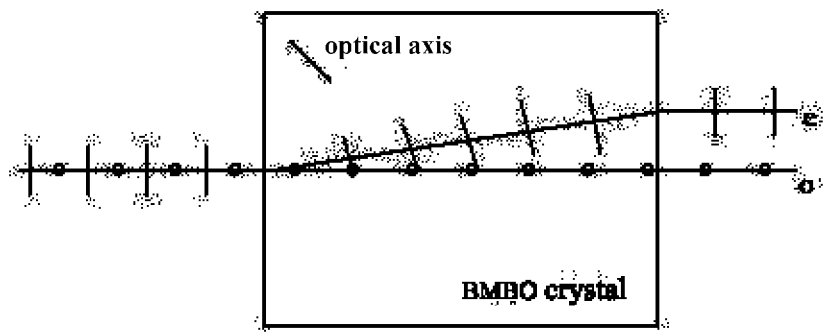
FIG. 7 is a schematic diagram illustrating a beam displacing polarizer fabricated by the barium magnesium borate birefringent crystal applied in ultraviolet (UV) or deep ultraviolet (DUV) range according to the present invention.

Embodiment 10, fabrication of the beam displacing polarizer by using the barium magnesium borate birefringent crystal of the present invention A birefringent crystal BMBO is processed so that the angle between the light axis plane and the edge is 45 degrees (FIG. 7). When the incident light is perpendicularly incident on the prism surface, two beams are separated. Larger birefringence is more beneficial for separation of the beams.

The invention claimed is:

1. A method for growing a borate birefringent crystal applicable to ultraviolet (UV) or deep ultraviolet (DUV) range, with chemical formula of $Ba_2Mg(B_3O_6)_2$, the method comprising: growing the crystal by a method of spontaneous crystallization from a melt, wherein the steps of growing crystal by the method of spontaneous crystallization from a melt are as follows:

mixing and grinding a compound containing barium, a compound containing magnesium and a compound containing boron in which the molar ratio of barium, magnesium and boron is 2:1:6, then putting the mixture into a platinum crucible, heating the mixture to a molten state to obtain a mixed melt, and stirring the mixed melt for 24-48 hours; determining a saturation temperature of the mixed melt by experimenting with seed crystal, and when heating the mixed melt to 2-20° C. above the saturation temperature, putting a seed rod without seed crystal into the melt; then cooling the melt at a rate of 0.05-5° C/h for spontaneously crystallizing, then letting the crystal grow at a cooling rate of 0.05-5° C/d; and pulling the crystal out of the melt surface when the crystal grows to a size of centimeter level, and cooling the melt to room temperature at a rate of 2-100° C/h to obtain the barium magnesium borate birefringent crystal.

2. The method for growing the borate birefringent crystal applicable to ultraviolet (UV) or deep ultraviolet (DUV) according to claim 1, wherein the compound containing barium is barium oxide, barium hydroxide, barium halide, barium carbonate, barium nitrate, barium sulfate, barium acetate or barium oxalate with purity not less than 99.9%; the compound containing magnesium is magnesium oxide, magnesium hydroxide, magnesium halide, magnesium carbonate, magnesium nitrate, magnesium sulfate, magnesium acetate or magnesium oxalate with purity not less than 99.9%; and the compound containing boron is boric acid or boron oxide with purity not less than 99.9%.

3. A method for growing a borate birefringent crystal applicable to ultraviolet (UV) or deep ultraviolet (DUV) range, with chemical formula of $Ba_2Mg(B_3O_6)_2$, the method comprising: growing the crystal by a Czochralski method, wherein the steps of growing crystal by the Czochralski method are as follows:

mixing and grinding a compound containing barium, a compound containing magnesium and a compound containing boron in which the molar ratio of barium, magnesium and boron is 2:1:6, then putting the mixture into a platinum crucible, heating the mixture to a molten state to obtain a mixed melt, and stirring the mixed melt for 24-48 hours; determining a saturation temperature of the mixed melt by experimenting with seed crystal, and when heating the mixed melt to 2-20° C. above the saturation temperature, putting a seed rod with the seed crystal fixed at its end into the mixed melt such that the seed rod is contacted with the surface of the mixed melt or dipped into the mixed melt; lowering the temperature of the mixed melt to the saturation temperature 0-60 minutes after the seed crystal is immerged, meanwhile rotating the seed rod at a rate of 0-100rpm/min; then growing crystal at a pulling rate of 0.01-10mm/h and a cooling rate of 0.05-5° C/d; and pulling the crystal out of the melt surface when the crystal grows to a size of centimeter level, and then cooling the melt to room temperature at a rate of 2-100° C/h to obtain the barium magnesium borate birefringent crystal.

4. The method for growing the borate birefringent crystal applicable to ultraviolet (UV) or deep ultraviolet (DUV) according to claim 3, wherein the compound containing barium is barium oxide, barium hydroxide, barium halide, barium carbonate, barium nitrate, barium sulfate, barium acetate or barium oxalate with purity not less than 99.9%; the compound containing magnesium is magnesium oxide, magnesium hydroxide, magnesium halide, magnesium carbonate, magnesium nitrate, magnesium sulfate, magnesium acetate or magnesium oxalate with purity not less than 99.9%; and the compound containing boron is boric acid or boron oxide with purity not less than 99.9%.

5. A method for growing a borate birefringent crystal applicable to ultraviolet (UV) or deep ultraviolet (DUV) range, with chemical formula of $Ba_2Mg(B_3O_6)_2$, the method comprising: growing the crystal by a flux method, wherein the steps of growing crystal by the flux method are as follows:

mixing and grinding a compound containing barium, a compound containing magnesium, a compound containing boron and a flux, then putting the mixture into a platinum crucible, heating the mixture to a molten state to obtain a mixed melt, and stirring the mixed melt for 24-48 hours; determining saturation temperature of the mixed melt by experimenting with seed crystal, and when heating the mixed melt to 2-20° C. above the saturation temperature, fixing the seed crystal at an end of a seed rod, and putting the seed rod into the mixed melt in a growth furnace, such that the seed rod is contacted with the surface of the mixed melt or dipped into the melt; lowering the temperature of the mixed melt to the saturation temperature 0-60 minutes after the seed crystal is immerged, meanwhile rotating the seed rod at a rate of 0-100rpm/min; then growing crystal at a cooling rate of 0.05-5° C/d, and pulling the crystal out of the melt surface when the crystal grows to a size of centimeter level, and then cooling the melt to room temperature at a rate of 2-100° C/h to obtain the barium magnesium borate birefringent crystal;

wherein the compound containing barium, the compound containing magnesium and the compound containing boron in which the molar ratio of barium, magnesium and boron is 2:1:6are mixed to form raw materials; and the molar ratio of the raw materials and the flux is 1: (0.2~4);

the flux is sodium fluoride, sodium oxide, barium fluoride, barium chloride, sodium chloride, lithium oxide, boron oxide or mixtures thereof.

6. The method for growing the borate birefringent crystal applicable to ultraviolet (UV) or deep ultraviolet (DUV) according to claim 5, wherein the purity of the flux is not less than 99.9%.

7. The method for growing the borate birefringent crystal applicable to ultraviolet (UV) or deep ultraviolet (DUV) according to claim 5, wherein the compound containing barium is barium oxide, barium hydroxide, barium halide, barium carbonate, barium nitrate, barium sulfate, barium acetate or barium oxalate with purity not less than 99.9%; the compound containing magnesium is magnesium oxide, magnesium hydroxide, magnesium halide, magnesium carbonate, magnesium nitrate, magnesium sulfate, magnesium acetate or magnesium oxalate with purity not less than 99.9%; and the compound containing boron is boric acid or boron oxide with purity not less than 99.9%.

* * * * *